US010522484B2

(12) United States Patent
Sato

(10) Patent No.: US 10,522,484 B2
(45) Date of Patent: Dec. 31, 2019

(54) WIRING SUBSTRATE

(71) Applicant: SHINKO ELECTRIC INDUSTRIES CO., LTD., Nagano-shi, Nagano-ken (JP)

(72) Inventor: Keigo Sato, Nagano (JP)

(73) Assignee: SHINKO ELECTRIC INDUSTRIES CO., LTD. (JP)

( * ) Notice: Subject to any disclaimer, the term of this patent is extended or adjusted under 35 U.S.C. 154(b) by 0 days.

(21) Appl. No.: 15/967,834

(22) Filed: May 1, 2018

(65) Prior Publication Data

US 2018/0337147 A1  Nov. 22, 2018

(30) Foreign Application Priority Data

May 18, 2017 (JP) .................. 2017-099021

(51) Int. Cl.
*H01L 23/64* (2006.01)
*H01L 23/498* (2006.01)
*H01L 49/02* (2006.01)

(52) U.S. Cl.
CPC ...... *H01L 23/642* (2013.01); *H01L 23/49811* (2013.01); *H01L 23/49822* (2013.01); *H01L 23/49827* (2013.01); *H01L 23/49838* (2013.01); *H01L 28/40* (2013.01); *H01L 2224/16225* (2013.01); *H01L 2224/32225* (2013.01); *H01L 2224/73204* (2013.01); *H01L 2924/15311* (2013.01)

(58) Field of Classification Search
CPC ............. H01L 23/642; H01L 23/49827; H01L 23/49838; H01L 28/40; H01L 23/49822; H01L 23/49811
See application file for complete search history.

(56) References Cited

U.S. PATENT DOCUMENTS

| | | | | |
|---|---|---|---|---|
| 9,529,260 B1* | 12/2016 | Chang | ..................... | G03F 7/038 |
| 2004/0154163 A1* | 8/2004 | Miyazaki | ............ | H01L 23/3107 |
| | | | | 29/832 |
| 2005/0006752 A1* | 1/2005 | Ogawa | ................ | H01L 21/4857 |
| | | | | 257/700 |
| 2006/0245139 A1* | 11/2006 | Kariya | ................... | H01G 4/232 |
| | | | | 361/272 |
| 2007/0141800 A1* | 6/2007 | Kurihara | .................. | H01G 4/33 |
| | | | | 438/396 |
| 2009/0120677 A1* | 5/2009 | Nomura | .............. | H01L 23/3677 |
| | | | | 174/262 |
| 2010/0020469 A1* | 1/2010 | Kurioka | ................. | H01G 4/018 |
| | | | | 361/321.1 |
| 2011/0121445 A1* | 5/2011 | Mori | ................... | H01L 23/5389 |
| | | | | 257/693 |

(Continued)

FOREIGN PATENT DOCUMENTS

JP    2006-210776 A    8/2006

*Primary Examiner* — Charles D Garber
*Assistant Examiner* — S M Sohel Imtiaz
(74) *Attorney, Agent, or Firm* — Tarolli, Sundheim, Covell & Tummino LLP

(57) ABSTRACT

A wiring substrate includes a substrate body, a post formed on an upper surface of the substrate body, a thin film capacitor, and a first insulation layer covering the thin film capacitor and the post. The thin film capacitor includes a reference hole extending through the thin film capacitor in a thickness-wise direction. The post is inserted through the reference hole.

12 Claims, 10 Drawing Sheets

(56) References Cited

U.S. PATENT DOCUMENTS

2012/0175754 A1* 7/2012 Furutani ................ H05K 1/185
　　　　　　　　　　　　　　　　　　　　　　257/668
2013/0284571 A1* 10/2013 Pillans ............... H01H 59/0009
　　　　　　　　　　　　　　　　　　　　　　200/181
2015/0295140 A1* 10/2015 Aoyagi ............... H01L 25/0753
　　　　　　　　　　　　　　　　　　　　　　257/99

* cited by examiner

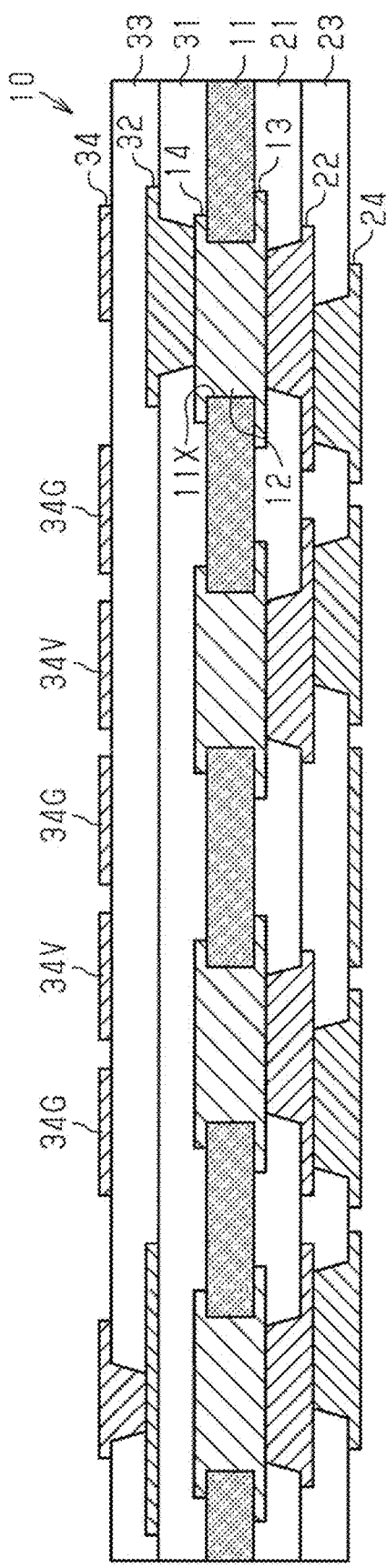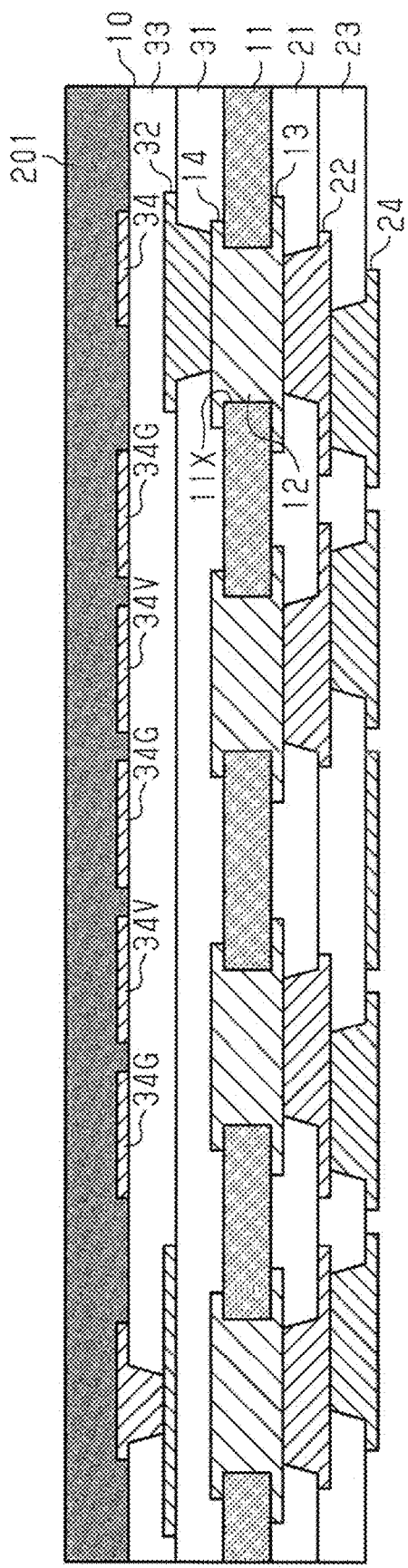

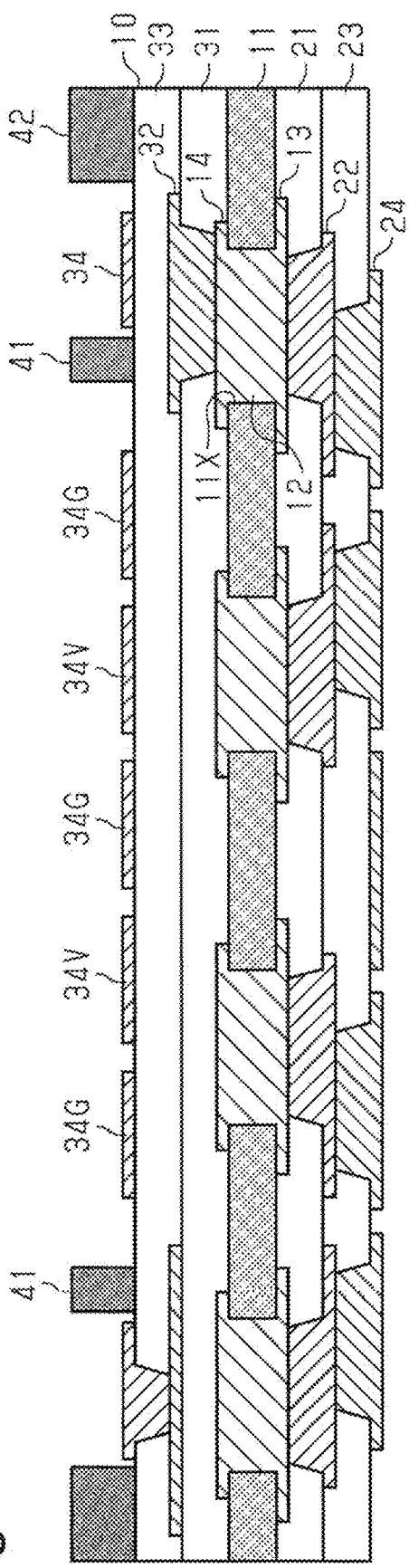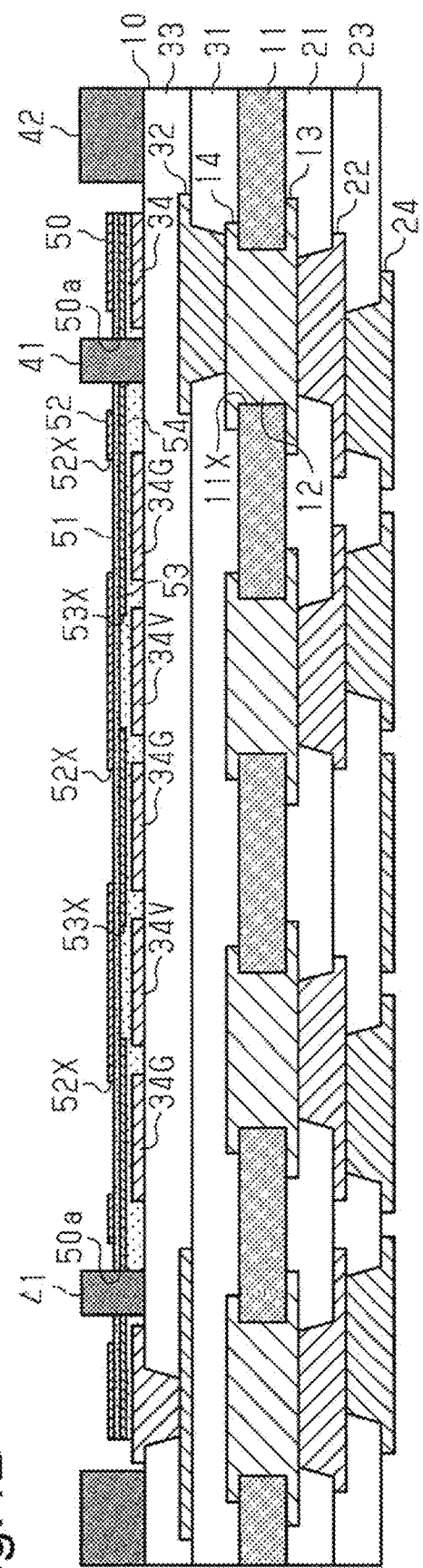

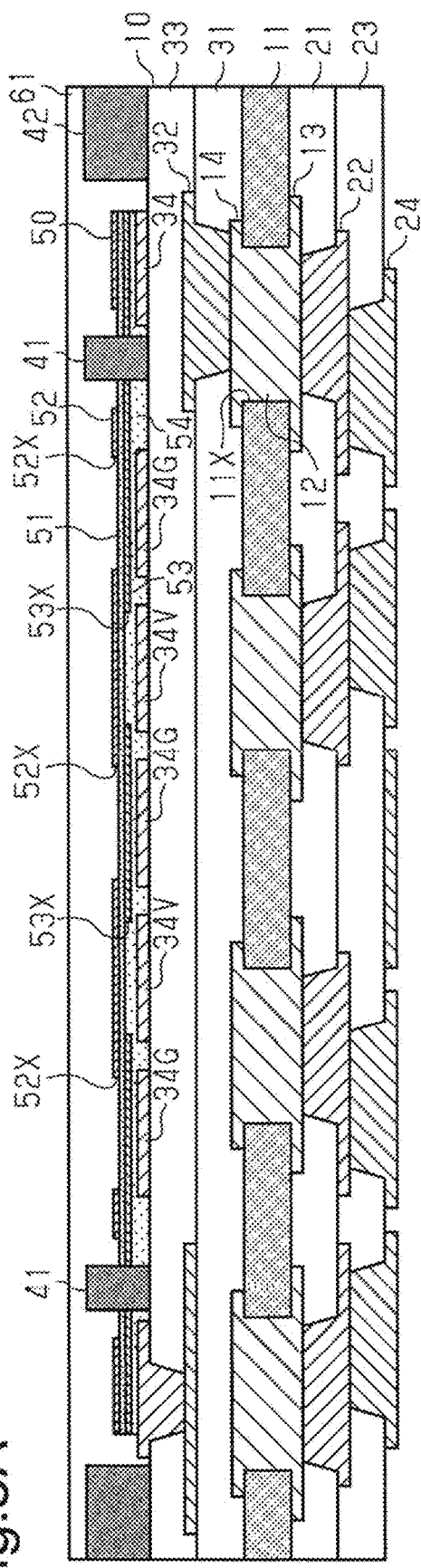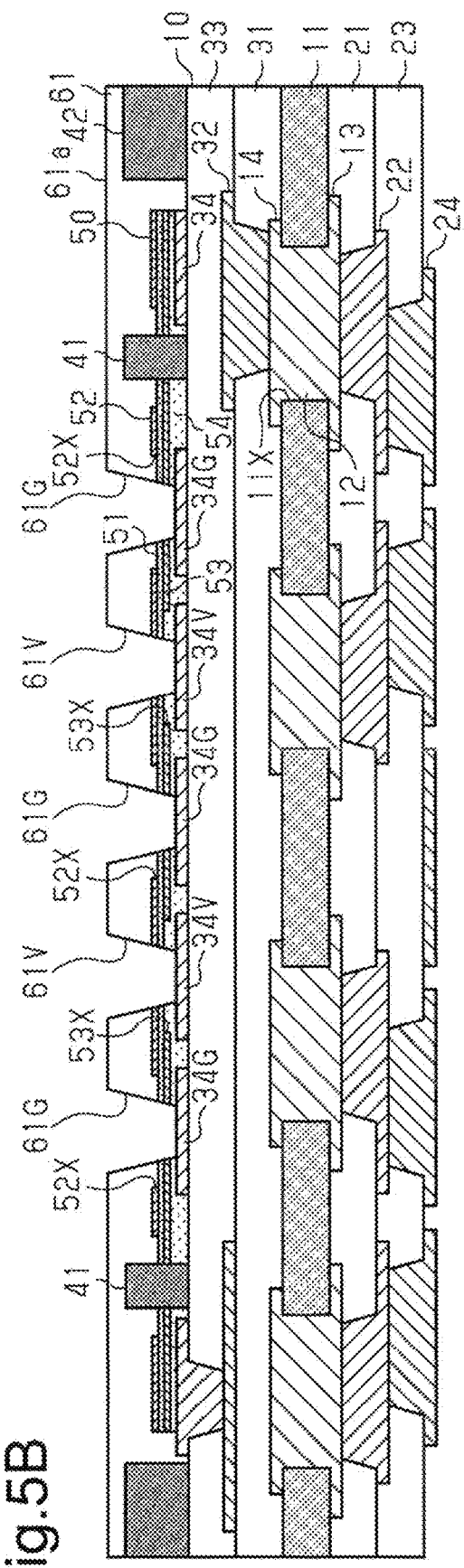

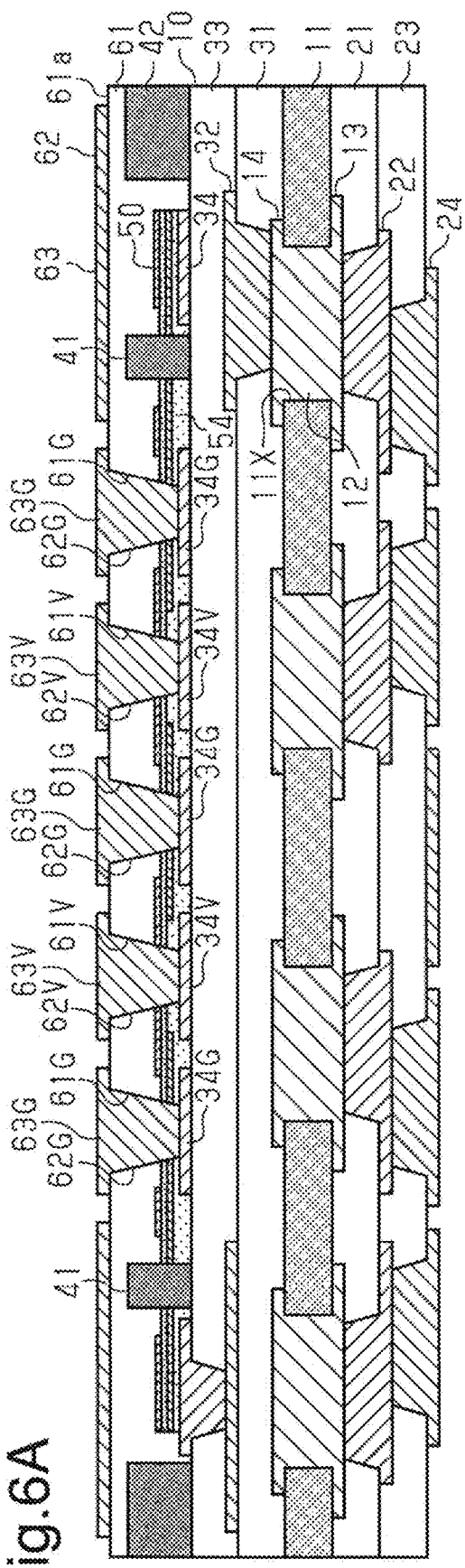
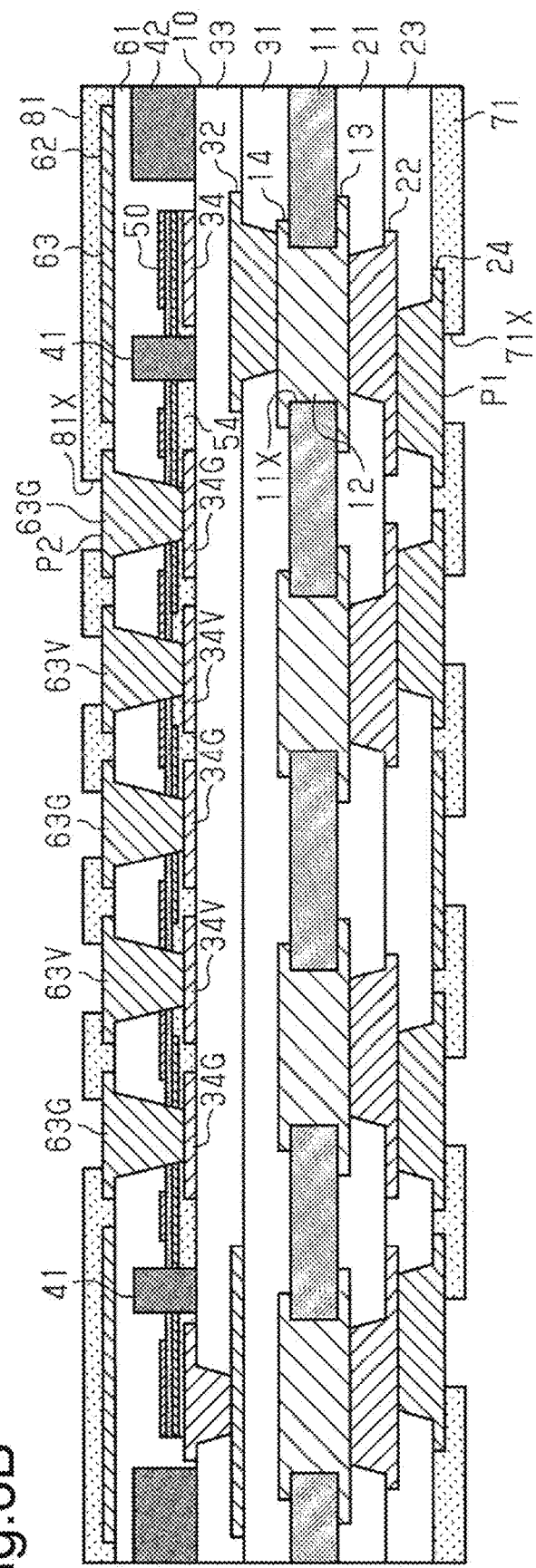
Fig.6A
Fig.6B

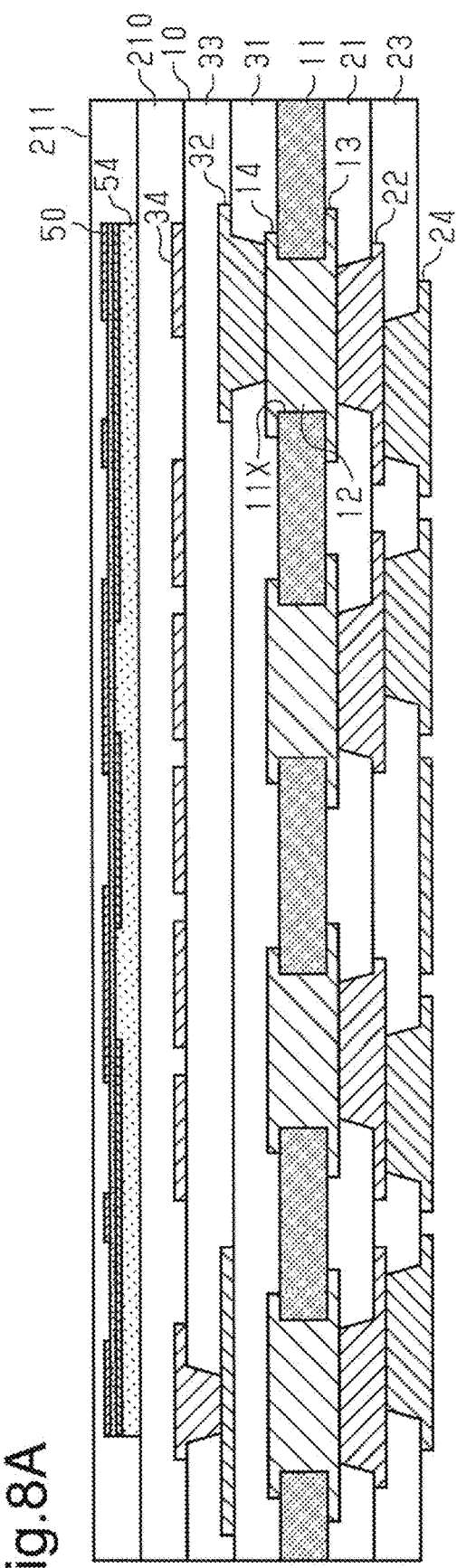

WIRING SUBSTRATE

CROSS-REFERENCE TO RELATED APPLICATIONS

This application is based upon and claims the benefit of priority from prior Japanese Patent Application No. 2017-099021, filed on May 18, 2017, the entire contents of which are incorporated herein by reference.

FIELD

This disclosure relates to a wiring substrate and a method for manufacturing a wiring substrate.

BACKGROUND

A conventional wiring substrate includes a semiconductor element and a chip capacitor that stabilizes an operation voltage of the semiconductor element. There is a tendency to increase the number of chip capacitors mounted on a wiring substrate. Increases in the number of chip capacitors affect the size of a wiring substrate and a layout of the mount surface. Thus, a wiring substrate incorporating a thin film capacitor has been proposed (refer to Japanese Laid-Open Patent Publication No. 2006-210776).

SUMMARY

In a wiring substrate incorporating a thin film capacitor such as that described above, the accuracy for mounting the thin film capacitor needs to be improved.

One embodiment is a wiring substrate. The wiring substrate includes a substrate body and a post formed on an upper surface of the substrate body. The wiring substrate also includes a thin film capacitor and a first insulation layer covering the thin film capacitor and the post. The thin film capacitor includes a reference hole extending through the thin film capacitor in a thickness-wise direction. The post is inserted through the reference hole.

Another embodiment is a method for manufacturing a wiring substrate. The method includes forming a post on an upper surface of a substrate body. The method also includes mounting a thin film capacitor, which includes a reference hole extending through the thin film capacitor in a thickness-wise direction, on the upper surface of the substrate body with an adhesive layer located in between so that the post is inserted through the reference hole. The method further includes forming a first insulation layer to cover the thin film capacitor and the post.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIGS. 3A, 3B, 4A, 4B, 5A, 5B, 6A, and 6B are schematic cross-sectional views illustrating a method for manufacturing one embodiment of a wiring substrate;

FIGS. 7A, 7B, 8A, and 8B are schematic cross-sectional views illustrating a method for manufacturing a comparative example of a wiring substrate;

DESCRIPTION OF THE EMBODIMENTS

Figure 1A:
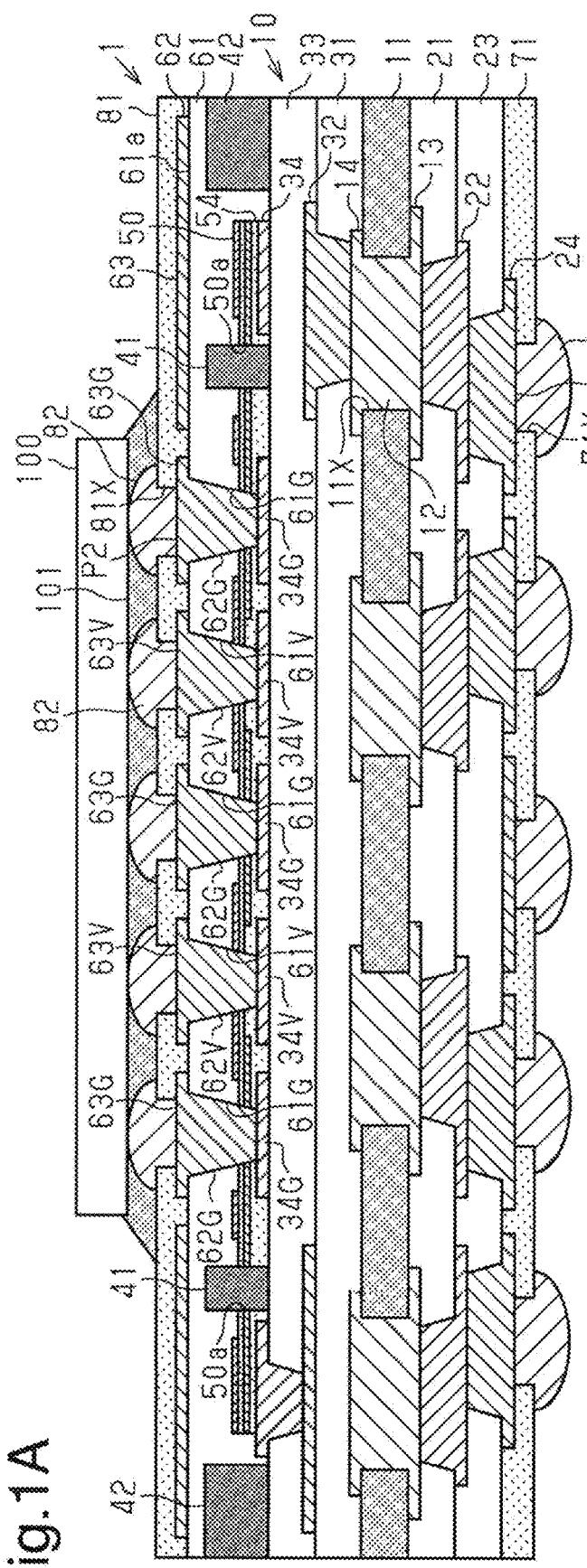
FIG. 1A is a schematic cross-sectional view of a semiconductor device including a wiring substrate on which a semiconductor element is mounted.

One embodiment will now be described with reference to the accompanying drawings. Elements in the drawings may be partially enlarged for simplicity and clarity and thus have not necessarily been drawn to scale. To facilitate understanding, hatching lines may not be illustrated or be replaced by shadings in the cross-sectional drawings. In the description hereafter, the "plan view" refers to the view of an object taken in the vertical direction (for example, upper-lower direction in FIG. 1A), and the "planar shape" refers to the shape of an object viewed in the vertical direction.

As illustrated in FIG. 1A, a semiconductor device includes a wiring substrate 1 and a semiconductor element 100 mounted on the wiring substrate 1. The wiring substrate 1 incorporates a thin film capacitor 50. The thin film capacitor 50 stabilizes the power supply voltage of the semiconductor element 100.

The wiring substrate 1 includes a substrate body 10. The substrate body 10 includes a core substrate 11 located proximate to the center in the thickness-wise direction of the substrate body 10. Through holes 11X extend through the core substrate 11 in the thickness-wise direction. Through electrodes 12 are formed in the through holes 11X. A wiring layer 13 is formed on the lower surface of the core substrate 11. A wiring layer 14 is formed on the upper surface of the core substrate 11. The wiring layers 13 and 14 are connected to each other by the through electrodes 12.

The material of the core substrate 11 may be, for example, a glass-epoxy resin obtained by impregnating a glass cloth (glass woven cloth), which functions as a reinforcement material, with a thermosetting insulative resin, the main component of which is an epoxy resin, and curing the resin. The reinforcement material is not limited to a glass cloth. For example, a glass non-woven cloth, an aramid woven cloth, an aramid non-woven cloth, a liquid crystal polymer (LCP) woven cloth, or an LCP non-woven cloth may be used as the reinforcement material. The thermosetting insulative resin is not limited to an epoxy resin. For example, a resin material such as a polyimide resin or a cyanate resin may be used as the thermosetting insulative resin. The material of the through electrodes 12 and the wiring layers 13 and 14 may be, for example, copper (Cu) or a copper alloy.

A plurality of (two in FIG. 1A) insulation layers 21 and 23 and a plurality of (two in FIG. 1A) wiring layers 22 and 24 are stacked on the lower surface of the core substrate 11.

The insulation layer 21 is formed on the lower surface of the core substrate 11 to cover the wiring layer 13. The wiring layer 22 is formed on the lower surface of the insulation layer 21. The wiring layer 22 includes via wirings, which extend through the insulation layer 21 in the thickness-wise direction, and a wiring pattern, which is formed on the lower surface of the insulation layer 21 and electrically connected to the wiring layer 13 by the via wirings.

The insulation layer 23 is formed on the lower surface of the insulation layer 21 to cover the wiring layer 22. The wiring layer 24 is formed on the lower surface of the insulation layer 23. The wiring layer 24 includes via wirings, which extend through the insulation layer 23 in the thickness-wise direction, and a wiring pattern, which is formed on the lower surface of the insulation layer 23 and electrically connected to the wiring layer 22 by the via wirings. The material of the insulation layers 21 and 23 may be, for example, an insulative resin such as an epoxy resin or a polyimide resin or a resin material in which such an insulative resin is mixed with filler such as silica or alumina. The material of the wiring layers 22 and 24 may be, for example, copper (Cu) or a copper alloy.

A plurality of (two in FIG. 1A) insulation layers 31 and 33 and a plurality of (two in FIG. 1A) wiring layers 32 and 34 are stacked on the upper surface of the core substrate 11. The insulation layer 31 is formed on the upper surface of the core substrate 11 to cover the wiring layer 14. The wiring layer 32 is formed on the upper surface of the insulation layer 31. The wiring layer 32 includes via wirings, which extend through the insulation layer 31 in the thickness-wise direction, and a wiring pattern, which is formed on the upper surface of the insulation layer 31 and electrically connected to the wiring layer 14 by the via wirings.

The insulation layer 33 is formed on the upper surface of the insulation layer 31 to cover the wiring layer 32. The wiring layer 34 is formed on the upper surface of the insulation layer 33. The wiring layer 34 includes via wirings, which extend through the insulation layer 33 in the thickness-wise direction, and a wiring pattern, which is formed on the upper surface of the insulation layer 33 and electrically connected to the wiring layer 32 by the via wirings. The material of the insulation layers 31 and 33 may be, for example, an insulative resin such as an epoxy resin or a polyimide resin or a resin material in which such an insulative resin is mixed with filler such as silica or alumina. The material of the wiring layers 32 and 34 may be, for example, copper (Cu) or a copper alloy.

The wiring layer 34 includes power supply lands 34V and ground lands 34G. Each of the power supply lands 34V is one example of a first land. Each of the ground lands 34G is one example of a second land. The power supply lands 34V and the ground lands 34G are arranged to supply a drive voltage to the semiconductor element 100. The power supply lands 34V and the ground lands 34G are each, for example, circular in a plan view.

Figure 2A:
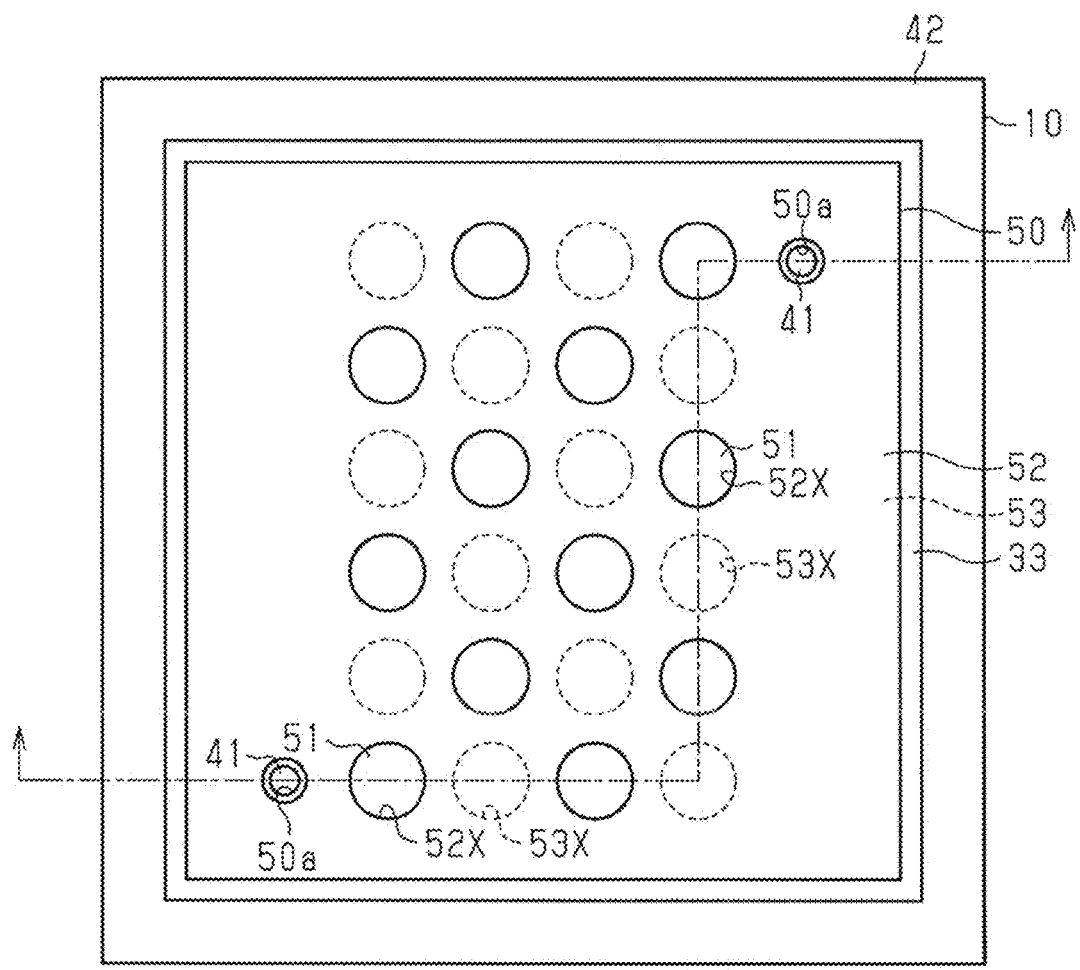
FIG. 2A is a schematic plan view of a thin film capacitor mounted on the wiring substrate.

Posts 41 are arranged on the upper surface of the substrate body 10 at given locations. The posts 41 are each, for example, cylindrical. Also, a frame 42 is arranged on the upper surface of the substrate body 10. As illustrated in FIG. 2A, the frame 42 has the form of a rectangular frame extending along the edges of the substrate body 10.

In the present embodiment, the substrate body 10 includes the insulation layer 33 and the wiring layer 34 located on the upper surface of the insulation layer 33. Thus, the upper surface of the substrate body 10 includes the upper surface of the wiring layer 34 and the upper surface of the insulation layer 33 that is exposed from the wiring layer 34. As illustrated in FIG. 1A, the posts 41 are formed, for example, on the upper surface of the insulation layer 33. However, the location where the posts 41 are formed is not limited to the upper surface of the insulation layer 33. The posts 41 may be formed, for example, on the upper surface of the wiring layer 34. Each of the posts 41 may be formed on both the upper surface of the insulation layer 33 and the upper surface of the wiring layer 34. Preferably, the posts 41 are formed on the upper surface of the insulation layer 33. When the posts 41 are formed on the upper surface of the insulation layer 33, the posts 41 and the insulation layer 33, both of which are formed from resin materials, closely adhere to each other. Such adhesion of resin materials increases the adhesion strength as compared to adhesion of different kinds of materials such as a resin and a metal.

As illustrated in FIG. 1A, the frame 42 is formed on the upper surface of the insulation layer 33. The frame 42 may cover part of the wiring layer 34. When the frame 42 is formed on the upper surface of the insulation layer 33, the frame 42 and the insulation layer 33, both of which are formed from resin materials, closely adhere to each other. Namely, in the same manner as the adhesion of the posts 41 and the insulation layer 33 described above, the adhesion of the frame 42 and the insulation layer 33 is also adhesion of resin materials. Thus, the adhesion strength is increased as compared to adhesion of different kinds of materials such as a resin and a metal. When the frame 42 is formed to cover part of the wiring layer 34, the size (width) of the frame 42 may be set regardless of the shape of the wiring layer 34.

For example, a photosensitive insulation material may be used as the material of the posts 41. Such a photosensitive insulation material may be, for example, a photosensitive epoxy insulation resin or a photosensitive acrylic insulation resin. Also, for example, a photosensitive insulation material may be used as the material of the frame 42. Such a photosensitive insulation material may be, for example, a photosensitive epoxy insulation resin or a photosensitive acrylic insulation resin.

The thin film capacitor 50 is mounted on the upper surface of the substrate body 10. The thin film capacitor 50 adheres to the upper surface of the substrate body 10 with an adhesive layer 54. The material of the adhesive layer 54 may be, for example, an epoxy, polyimide, or silicone adhesive. The thin film capacitor 50 is arranged at an inner side of the frame 42 in a plan view. Reference holes 50a extend through the thin film capacitor 50 in the thickness-wise direction of the thin film capacitor 50. The posts 41 are inserted through the reference holes 50a. The size (diameter) of each reference hole 50a may be set to, for example, 45 to 55 μm. The size (diameter) of each post 41 may be set to, for example, 40 to 50 μm. The thin film capacitor 50 is positioned by the posts 41 inserted through the reference holes 50a.

Figure 1B:
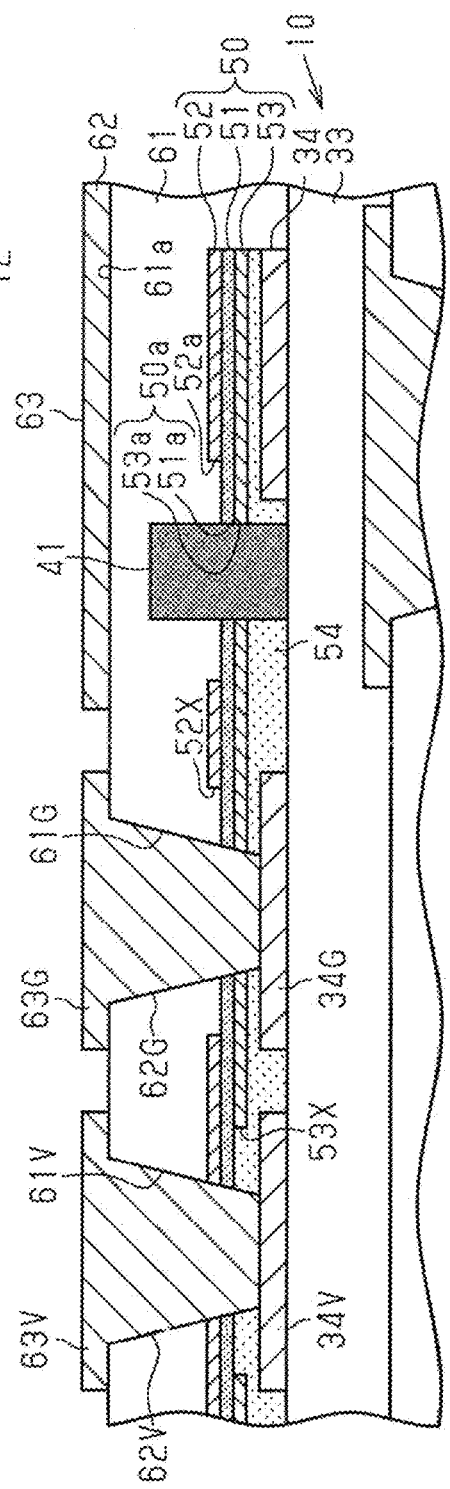
FIG. 1B is a partially enlarged cross-sectional view of the wiring substrate illustrated in FIG. 1A.

As illustrated in FIG. 1B, the thin film capacitor 50 includes a dielectric layer 51, a first electrode 52, and a second electrode 53. The dielectric layer 51 is held between the first electrode 52 and the second electrode 53. The material of the dielectric layer 51 is a material with high permittivity such as barium strontium titanate (BST), barium titanate, strontium titanate, lead zirconate titanate (PZT), lead lanthanum zirconate titanate (PLZT), or bismuth titanate. The material of the first electrode 52 and the second electrode 53 is, for example, copper (Cu), a copper alloy, or nickel (Ni).

As illustrated in FIG. 1B, in the thin film capacitor 50 of the present embodiment, the first electrode 52 has openings 52a, in which the reference holes 50a are located. Each of the reference holes 50a includes a through hole 51a extending through the dielectric layer 51 in the thickness-wise direction and a through hole 53a extending through the second electrode 53 in the thickness-wise direction. The openings 52a of the first electrode 52 have larger diameters than the through holes 51a of the dielectric layer 51 to prevent contact of the first electrode 52 with the second electrode 53 in the through holes 51a of the dielectric layer 51. The through holes 53a of the second electrode 53 may have larger diameters than the through holes 51a of the dielectric layer 51. In other words, the reference holes 50a may be formed by only the through holes 51a.

Figure 2B:
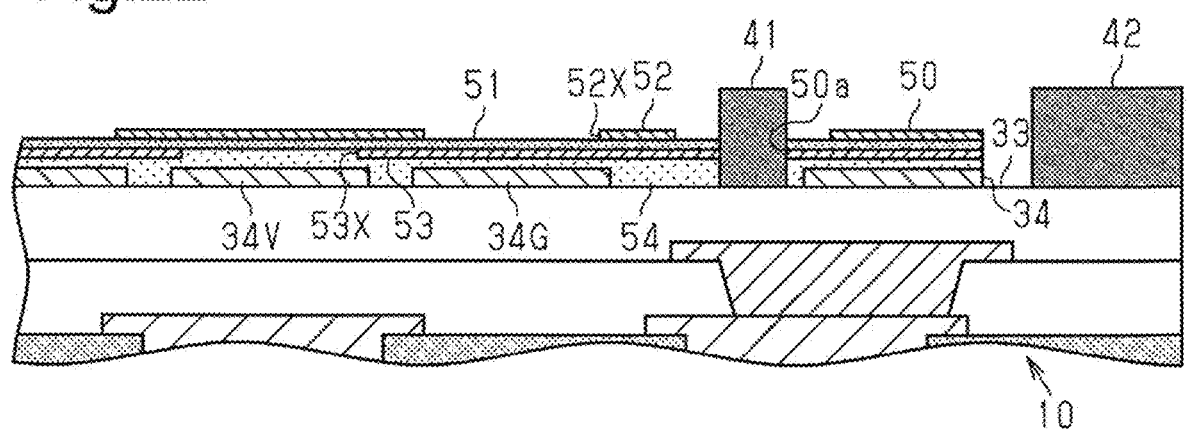
FIG. 2B is a partially enlarged cross-sectional view of the structure illustrated in FIG. 2A.

FIGS. 2A and 2B illustrate the thin film capacitor 50 mounted on the substrate body 10. FIGS. 2A and 2B illustrate a state prior to formation of an insulation layer 61 (refer to FIG. 5A) in the manufacturing steps of the wiring substrate 1, which will be described later. The thin film capacitor 50 is rectangular plate-shaped. The first electrode 52 of the thin film capacitor 50 includes openings 52X exposing the upper surface of the dielectric layer in given positions. The second electrode 53 of the thin film capacitor 50 includes openings 53X exposing the lower surface of the dielectric layer 51 in given positions.

As illustrated in FIG. 2A, each of the openings 52X (indicated by solid lines) of the first electrode 52 is, for example, circular in a plan view. Each of the openings 53X (indicated by broken lines) of the second electrode 53 is, for example, circular in a plan view. The openings 52X of the first electrode 52 and the openings 53X of the second electrode 53 are formed where the openings 52X do not overlap with the openings 53X in a plan view.

In the present embodiment, the thin film capacitor 50 includes two reference holes 50a. As illustrated in FIG. 2A, the reference holes 50a are formed proximate to two diagonal corners of the thin film capacitor 50, which is rectangular in a plan view. The posts 41 are formed in positions corresponding to the reference holes 50a of the thin film capacitor 50.

As illustrated in FIG. 1A, the thin film capacitor 50 is covered by the insulation layer 61. The insulation layer 61 is formed to cover the posts 41 and the frame 42. As illustrated in FIG. 1B, in the present embodiment, the side surface of the post 41 is in contact with the side wall of the reference hole 50a (in example of FIG. 1B, side wall of dielectric layer 51 defining through hole 51a and side wall of second electrode 53 defining through hole 53a). The material of the insulation layer 61 may be, for example, an insulative resin such as an epoxy resin or a polyimide resin or a resin material in which such an insulative resin is mixed with filler such as silica or alumina.

As illustrated in FIG. 1B, the insulation layer 61 includes via holes 61V and 61G. The via holes 61V are open in an upper surface 61a of the insulation layer 61 to partially expose the upper surfaces of the power supply lands 34V of the wiring layer 34. Each via hole 61V is located in the corresponding opening 53X of the second electrode 53 of the thin film capacitor 50 and extends through the dielectric layer 51 and the first electrode 52. In other words, the via hole 61V includes a through hole extending through the insulation layer 61 in the thickness-wise direction, a through hole extending through the first electrode 52 of the thin film capacitor 50 in the thickness-wise direction, a through hole extending through the dielectric layer 51 of the thin film capacitor 50 in the thickness-wise direction, and a through hole extending through the adhesive layer 54 in the thickness-wise direction. The wall surface of the via hole 61V exposes an end portion of the first electrode 52 where the via hole 61V extends through.

The via holes 61G are open in the upper surface 61a of the insulation layer 61 to partially expose the upper surfaces of the ground lands 34G of the wiring layer 34. Each via hole 61G is located in the corresponding opening 52X of the first electrode 52 of the thin film capacitor 50 and extends through the dielectric layer 51 and the second electrode 53. In other words, the via hole 61G includes a through hole extending through the insulation layer 61 in the thickness-wise direction, a through hole extending through the dielectric layer 51 of the thin film capacitor 50 in the thickness-wise direction, a through hole extending through the second electrode 53 of the thin film capacitor 50 in the thickness-wise direction, and a through hole extending through the adhesive layer 54 in the thickness-wise direction. The wall surface of the via hole 61G exposes an end portion of the second electrode 53 where the via hole 61G extends through.

A wiring layer 62 is formed on the upper surface 61a of the insulation layer 61. The wiring layer 62 includes a wiring pattern 63, which is formed on the upper surface 61a of the insulation layer 61, and via wirings 62V and 62G, which are respectively formed in the via holes 61V and 61G. The via wirings 62V and 62G extend through the insulation layer 61, the thin film capacitor 50, and the adhesive layer 54 in the thickness-wise direction. In the same manner as the via holes 61V and 61G, the via wirings 62V and 62G each have the form of an inverted truncated cone so that the diameter is gradually decreased from the upper surface 61a of the insulation layer 61 toward the wiring layer 34.

The wiring pattern 63 of the wiring layer 62 includes pads 63V connected to the via wirings 62V and pads 63G connected to the via wirings 62G. The pads 63V and 63G are used as mount pads on which the semiconductor element 100 is mounted and are connected to power supply terminals of the semiconductor element 100. Although not illustrated in the drawings, the wiring layer 62 includes other via wirings and other mount pads connected to the semiconductor element 100.

As described above, the via wirings 62V are formed in the via holes 61V, and the end portions of the first electrode 52 are exposed in the wall surfaces of the via holes 61V. Thus, the via wirings 62V are connected to the first electrode 52. The via wirings 62V electrically connect the pads 63V of the wiring layer 62 to the first electrode 52 of the thin film capacitor 50 and the power supply lands 34V of the wiring layer 34.

The via wirings 62G are formed in the via holes 61G, and the end portions of the second electrode 53 are exposed in the wall surfaces of the via holes 61G. Thus, the via wirings 62G are connected to the second electrode 53. The via wirings 62G electrically connect the pads 63G of the wiring layer 62 to the second electrode 53 of the thin film capacitor 50 and the ground lands 34G of the wiring layer 34.

As illustrated in FIG. 1A, a solder resist layer 71 is formed on the lower surface of the insulation layer 23. The solder resist layer 71 covers the lower surface of the insulation layer 23 and part of the wiring layer 24. The solder resist layer 71 includes openings 71X exposing part of the lower surface of the wiring layer 24 as external connection pads P1. The material of the solder resist layer 71 may be, for example, an insulative resin such as an epoxy resin or an acrylic resin.

The external connection pads P1 are connected to external connection terminals 72 used to mount the wiring substrate 1 on a mount board such as a motherboard. The external connection terminals 72 are, for example, solder bumps. Alternatively, the external connection terminals 72 may be, for example, solder balls or lead pins.

As necessary, an OSP process may be performed on the surface of the wiring layer 24 exposed from the openings 71X of the solder resist layer 71 to form an OSP film, and the external connection terminals 72 may be connected to the OSP film. Alternatively, the external connection terminals 72 may be connected to a metal layer formed on the surface of the wiring layer 24 exposed from the openings 71X. The metal layer may be, for example, an Au layer, an Ni layer/Au layer (metal layer in which Au layer is formed on Ni layer serving as bottom layer), or an Ni layer/Pd layer/Au layer (metal layer in which Ni layer serves as bottom layer and Ni layer, Pd layer, and Au layer are sequentially stacked). The wiring layer 24 exposed from the openings 71X may be used as the external connection terminals. When an OSP film or metal layer is formed on the wiring layer 24, the OSP film or metal layer may be used as the external connection terminals.

A solder resist layer 81 is formed on the upper surface 61a of the insulation layer 61. The solder resist layer 81 covers the upper surface 61a of the insulation layer 61 and part of the wiring layer 62. The solder resist layer 81 includes openings 81X exposing part of the upper surface of the wiring layer 62 (in FIG. 1A, part of each of pads 63V and 63G) as external connection pads P2. The material of the solder resist layer 81 may be, for example, an insulative resin such as an epoxy resin or an acrylic resin.

External connection terminals 82 are formed on the external connection pads P2. The external connection terminals 82 are, for example, solder bumps. The semiconductor element 100 is flip-chip-connected to the external connection terminals 82.

As necessary, an OSP process may be performed on the surface of the wiring layer 62 exposed from the openings 81X of the solder resist layer 81 to form an OSP film, and the external connection terminals 82 may be connected to the OSP film. Alternatively, the external connection terminals 82 may be connected to a metal layer formed on the surface of the wiring layer 62 exposed from the openings 81X. The metal layer may be, for example, an Au layer, an Ni layer/Au layer (metal layer in which Au layer is formed on Ni layer serving as bottom layer), or an Ni layer/Pd layer/Au layer (metal layer in which Ni layer serves as bottom layer and Ni layer, Pd layer, and Au layer are sequentially stacked). The wiring layer 62 exposed from the openings 81X may be used as the external connection terminals. When an OSP film or metal layer is formed on the wiring layer 62, the OSP film or metal layer may be used as the external connection terminals.

The gap between the wiring substrate 1 and the semiconductor element 100 is filled with an underfill resin 101. The material of the underfill resin 101 may be, for example, an insulative resin such as an epoxy resin. The underfill resin 101 improves the connection strength of connection parts between the wiring substrate 1 and the semiconductor element 100.

Wiring Substrate Manufacturing Steps

Steps of manufacturing the wiring substrate 1 will now be described.

As illustrated in FIG. 3A, the substrate body 10 is formed. The core substrate 11 is first prepared. For example, a copper clad laminate (CCL) may be used as the core substrate 11. The through holes 11X are formed in the core substrate 11. The through electrodes 12 are formed in the through holes 11X, for example, through electrolytic plating or electrical conductive paste filling. Subsequently, the wiring layers 13 and 14 are formed through a subtractive process.

The insulation layers 21 and 31 are formed to cover the wiring layers 13 and 14. The material of the insulation layers 21 and 31 may be, for example, an organic resin such as an epoxy resin or a polyimide resin or a resin material in which such an organic resin is mixed with filler such as silica or alumina. The insulation layers 21 and 31 are obtained, for example, by laminating with resin films under vacuum and curing the resin films with heat. Alternatively, the insulation layers 21 and 31 may be formed by applying and heating a resin paste or a resin liquid.

The wiring layer 22 is formed on the lower surface of the insulation layer 21. The wiring layer 32 is formed on the upper surface of the insulation layer 31. For example, openings are formed in the insulation layers 21 and 31. After a desmear process is performed if necessary, the wiring layers 22 and 32 are formed, for example, through a semi-additive process.

The insulation layers 23 and 33 are formed to cover the wiring layers 22 and 32. The material of the insulation layers 23 and 33 may be, for example, an organic resin such as an epoxy resin or a polyimide resin or a resin material in which such an organic resin is mixed with filler such as silica or alumina. The insulation layers 23 and 33 are obtained, for example, by laminating with resin films under vacuum and curing the resin films with heat. Alternatively, the insulation layers 23 and 33 may be formed by applying and heating a resin paste or a resin liquid.

The wiring layer 24 is formed on the lower surface of the insulation layer 23. The wiring layer 34 is formed on the upper surface of the insulation layer 33. For example, openings are formed in the insulation layers 23 and 33. After a desmear process is performed if necessary, the wiring layers 24 and 34 are formed, for example, through a semi-additive process. The wiring pattern of the wiring layer 34 includes the power supply lands 34V and the ground lands 34G.

As illustrated in FIG. 3B, a resin layer 201 is formed to cover the upper surface of the substrate body 10, that is, the insulation layer 33 and the wiring layer 34. For example, the resin layer 201 may be formed by laminating with a photosensitive resin film under vacuum. The material of the photosensitive resin film may be, for example, a photosensitive epoxy insulation resin or a photosensitive acrylic insulation resin.

As illustrated in FIG. 4A, the resin layer 201 undergoes exposure and development to obtain the posts 41 and the frame 42.

As illustrated in FIG. 4B, the thin film capacitor 50 is mounted on the upper surface of the insulation layer 33 and the upper surface of the wiring layer 34 with the adhesive layer 54 located in between. As illustrated in the enlarged cross-sectional view of FIG. 1B, the reference holes 50a are formed in the thin film capacitor 50 extending through the thin film capacitor 50 in the thickness-wise direction. As illustrated in FIG. 4B, the posts 41 are inserted through the reference holes 50a. The posts 41, which are inserted through the reference holes 50a, position the thin film capacitor 50 on the upper surface of the insulation layer 33 and the upper surface of the wiring layer 34. The openings 53X of the second electrode 53 are located above the power supply lands 34V of the wiring layer 34, and the openings 52X of the first electrode 52 are located above the ground lands 34G of the wiring layer 34.

As illustrated in FIG. 5A, the insulation layer 61 is formed to cover the thin film capacitor 50, the posts 41, and the frame 42. The insulation layer 61 is obtained, for example, by applying a resin paste or a resin liquid and curing the resin with heat. The insulation layer 61 may be formed by vacuum-laminating and heating a resin film.

As illustrated in FIG. 5B, the via holes 61V and 61G are formed in the insulation layer 61. The via holes 61V and 61G may be formed, for example, using a laser drilling machine such as a $CO_2$ laser or a UV-YAG laser. When irradiation positions of laser beams are located in accordance with the openings 52X and 53X of the thin film capacitor 50, the upper surface 61a of the insulation layer 61 is irradiated with laser beams to form the via holes 61V and 61G. The laser drilling exposes the end portions of the first electrode 52 of the thin film capacitor 50 in the wall surfaces of the via holes 61V and the end portions of the second electrode 53 of the thin film capacitor 50 in the wall surfaces of the via holes 61G. The use of laser drilling easily forms the via holes 61V, which extend through the insulation layer 61, the first electrode 52 and the dielectric layer 51 of the thin film capacitor 50, and the adhesive layer 54, and the via holes 61G, which extend through the insulation layer 61, the dielectric layer 51 and the second electrode 53 of the thin film capacitor 50, and the adhesive layer 54.

In the step of forming the via holes 61V and 61G, the diameter (drilled diameter) of each via hole 61G at a portion extending through the thin film capacitor 50 is set to be smaller than the diameter of the opening 52X of the first electrode 52. Also, the diameter (drilled diameter) of each via hole 61V at a portion extending through the thin film capacitor 50 is set to be smaller than the diameter of the opening 53X of the second electrode 53. Thus, the adhesive layer 54 remains between the wall surface of the via hole 61V and the end portion of the second electrode 53 of the thin film capacitor 50 defining the opening 53X. Also, the insulation layer 61 remains between the wall surface of the via hole 61G and the end portion of the first electrode 52 of the thin film capacitor 50 defining the opening 52X.

As illustrated in FIG. 6A, the wiring layer 62 is formed. For example, a seed layer (not illustrated) is formed on the upper surface 61a of the insulation layer 61, the wall surfaces of the via holes 61V and 61G, and the upper surface of the wiring layer 34 exposed by the via holes 61V and 61G (upper surfaces of power supply lands 34V and upper surfaces of ground lands 34G). The material of the seed layer may be, for example, copper or a copper alloy. The seed layer may be formed, for example, through electroless plating or sputtering.

The seed layer is covered by a resist layer (not illustrated) including openings in given positions. The openings are formed in positions corresponding to where the wiring layer 62 is to be formed. For example, a material having resistance to plating performed in the next step may be used as the resist layer.

Electrolytic plating (electrolytic copper plating) in which the seed layer serves as the power feeding electrode is performed to deposit and develop a plating metal on the seed layer exposed in the openings of the resist layer. The resist layer is removed, for example, through asking or using an alkaline stripping solution. The exposed seed layer is removed through etching. This forms the wiring layer 62.

As illustrated in FIG. 6B, the solder resist layer 71 including the openings 71X and the solder resist layer 81 including the openings 81X are formed. The solder resist layer 71 is obtained, for example, by laminating the insulation layer 23 and the wiring layer 24 with a photosensitive solder resist film or applying a liquid solder resist to the insulation layer 23 and the wiring layer 24 and then exposing and developing the resist through photolithography to be patterned into a desired shape. In the same manner, the solder resist layer 81 is obtained, for example, by laminating the insulation layer 61 and the wiring layer 62 with a photosensitive solder resist film or applying a liquid solder resist to the insulation layer 61 and the wiring layer 62 and then exposing and developing the resist through photolithography to be patterned into a desired shape.

The external connection terminals 72, which are illustrated in FIG. 1A, are formed on the lower surface of the wiring layer 24 exposed from the openings 71X of the solder resist layer 71 (external connection pads P1). The external connection terminals 72 are, for example, solder bumps. The solder bumps may be formed by reflowing solder balls mounted on the external connection pads P1 or a solder paste applied to the external connection pads P1.

In the same manner, the external connection terminals 82, which are illustrated in FIG. 1A, are formed on the upper surface of the wiring layer 62 exposed from the openings 81X of the solder resist layer 81 (external connection pads P2). The external connection terminals 72 are, for example, solder bumps. The solder bumps may be formed by reflowing solder balls mounted on the external connection pads P2 or a solder paste applied to the external connection pads P2.

Manufacturing Process of Comparative Example of Wiring Substrate

The process for manufacturing a comparative example of a wiring substrate will now be described with reference to FIGS. 7A to 8B. The same names and reference characters are given to those components that are the same as the corresponding components of the above embodiment. Such components will not be described in detail.

Figure 7A:
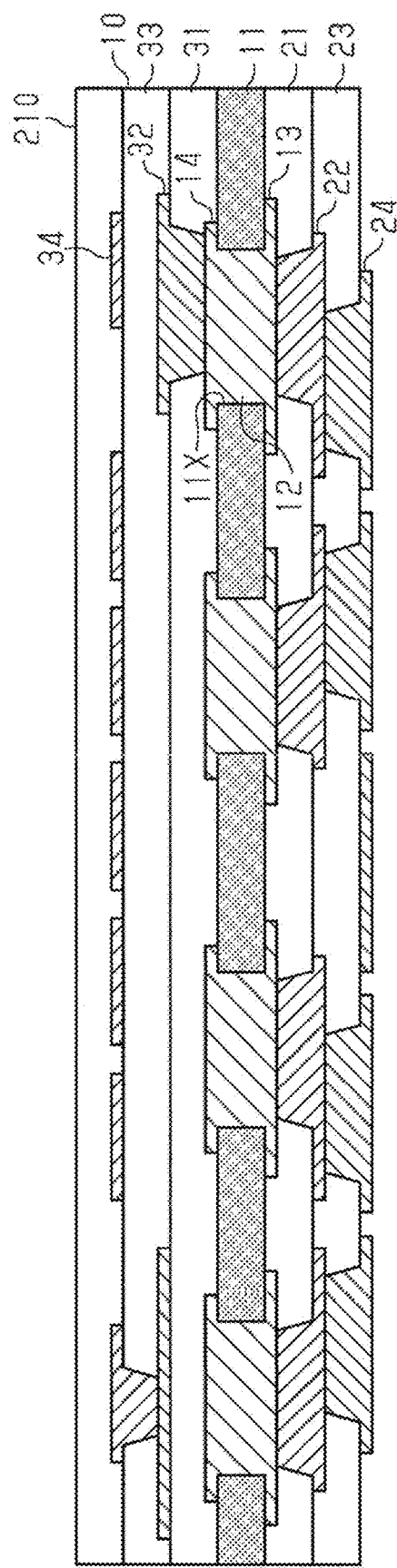
Figure 7B:
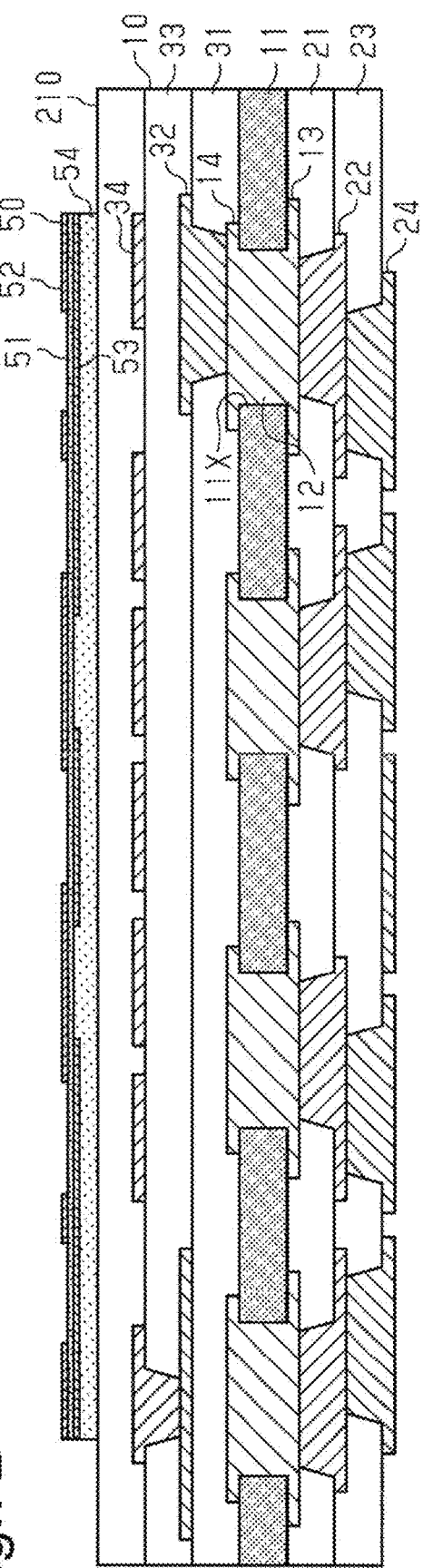

As illustrated in FIG. 7A, the insulation layer 210 is formed to cover the wiring layer 34 of the substrate body 10. As illustrated in FIG. 7B, the thin film capacitor 50 is mounted on the upper surface of the insulation layer 210 with the adhesive layer 54 located in between.

As illustrated in FIG. 8A, the insulation layer 211 is formed to cover the thin film capacitor 50. As illustrated in FIG. 8B, the upper surface of the insulation layer 211 is, for example, irradiated with laser beams using a laser drilling machine to form via holes 211X exposing part of the upper surface of the wiring layer 34. Then, a wiring layer (not illustrated) including via wirings filled in the via holes 211X is formed.

Comparison of Embodiment and Comparative Example

In the comparative example, as illustrated in FIG. 7B, when the thin film capacitor 50 is mounted on the upper surface of the insulation layer 210, for example, the positions of alignment marks formed on the upper surface of the insulation layer 33 in the same manner as the formation of the wiring layer 34 need to be checked through the insulation layer 210 so that the thin film capacitor 50 is positioned based on the alignment marks. However, the alignment marks covered with the insulation layer 210 are difficult to check. This lowers the accuracy of the position of the thin film capacitor 50 located on the upper surface of the insulation layer 210.

In the comparative example, the thin film capacitor 50 is covered by the insulation layer 211. When the insulation layer 211 is formed, for example, by applying a resin film as the material of the insulation layer 211 to the thin film capacitor 50, pressure applied to the thin film capacitor 50 or contraction of the resin causes misalignment of the thin film capacitor 50. Variations in the position of the thin film capacitor 50 lower the position accuracy of the thin film capacitor 50.

Hence, in the comparative example, when the via holes 211X are formed, large margins are needed in accordance with the position accuracy of the thin film capacitor 50. For example, a decrease in the diameter (drilled diameter) of the via holes 211X may prevent the wall surface of one via hole 211X from exposing the end portions of the first electrode 52 and the second electrode 53 of the thin film capacitor 50. However, a decrease in the diameter of the via holes 211X decreases the diameter of via wirings formed in the via holes 211X. This may lower the connection reliability of each via wiring and the wiring layer 34, the connection reliability of the first electrode 52 of the thin film capacitor 50 and the corresponding via wiring, and the connection reliability of the second electrode 53 of the thin film capacitor 50 and the corresponding via wiring.

In this regard, in the present embodiment, the posts 41 are formed on the upper surface of the substrate body 10. The thin film capacitor 50 is mounted on the upper surface of the substrate body 10 so that the posts 41 are inserted through the reference holes 50a of the thin film capacitor 50. Thus, the thin film capacitor 50 is aligned without performing a process such as checking the alignment marks through the insulation layer as in the comparative example.

Additionally, the frame 42 is formed on the upper surface of the substrate body 10 to surround the thin film capacitor 50. The frame 42 facilitates the filling of the insulation layer 61 covering the thin film capacitor 50. Thus, the frame 42 allows for easy formation of the insulation layer 61 covering the thin film capacitor 50.

Further, the posts 41 prevent the thin film capacitor 50 from moving on the upper surface of the substrate body 10. This improves the mounting accuracy of the thin film capacitor 50.

As illustrated in FIG. 1B, in the present embodiment, the side surface of each post 41 is in contact with the side wall of the corresponding reference hole 50a. In other words, the size (diameter) of the post 41 and the size (diameter) of the reference hole 50a are set to be the same so that the side surface of the post 41 contacts the side wall of the reference hole 50a. This prevents movement of the thin film capacitor 50 caused by pressing force produced during formation of the insulation layer 61 and improves the mounting accuracy of the thin film capacitor 50.

As described above, the posts 41, which are arranged on the upper surface of the substrate body 10, allow the thin film capacitor 50 to be mounted on the upper surface of the substrate body 10 with high accuracy. This eliminates the need for large margins when forming the via holes 61V and 61G in the insulation layer 61 covering the thin film capacitor 50. Thus, the via holes 61V and 61G may be enlarged. Accordingly, the area connecting the via wirings 62V and the power supply lands 34V of the wiring layer 34 in the via holes 61V as well as the area connecting the via wirings 62V and the first electrode 52 of the thin film capacitor 50 may be increased. This improves the connection reliability of the via wirings 62V and the power supply lands 34V and the connection reliability of the via wirings 62V and the first electrode 52. In the same manner, the area connecting the via wirings 62G and the ground lands 34G of the wiring layer 34 in the via holes 61G as well as the area connecting the via wirings 62G and the second electrode 53 of the thin film capacitor 50 may be increased. This improves the connection reliability of the via wirings 62G and the ground lands 34G and the connection reliability of the via wirings 62G and the second electrode 53.

The present embodiment has the advantages described below.

(1) The wiring substrate 1 includes the thin film capacitor 50, which limits variations of the power supply voltage of the semiconductor element 100 mounted on the wiring substrate 1. The wiring substrate 1 includes the substrate body 10 and the posts 41 arranged on the upper surface of the substrate body 10. The thin film capacitor 50 is mounted on the upper surface of the substrate body 10 so that the posts 41 are inserted through the reference holes 50a of the thin film capacitor 50. Thus, the thin film capacitor 50 is aligned without performing a process such as checking alignment marks through an insulation layer. This improves the mounting accuracy of the thin film capacitor 50.

(2) The frame 42 is arranged on the upper surface of the substrate body 10 to surround the thin film capacitor 50. The frame 42 allows for easy formation of the insulation layer 61 covering the thin film capacitor 50.

(3) The posts 41 prevent the thin film capacitor 50 from moving on the upper surface of the substrate body 10. This improves the mounting accuracy of the thin film capacitor 50.

(4) The side surface of each post 41 is in contact with the side wall of the corresponding reference hole 50a. In other words, the size (diameter) of the post 41 and the size (diameter) of the reference hole 50a are set to be the same so that the side surface of the post 41 contacts the side wall of the reference hole 50a. This prevents movement of the thin film capacitor 50 caused by pressing force produced during formation of the insulation layer 61 and improves the mounting accuracy of the thin film capacitor 50.

(5) The posts 41, which are arranged on the upper surface of the substrate body 10, allow the thin film capacitor 50 to be mounted on the upper surface of the substrate body 10 with high accuracy. This eliminates the need for large margins when forming the via holes 61V and 61G in the insulation layer 61 covering the thin film capacitor 50. Thus, the via holes 61V and 61G may be enlarged. Accordingly, the area connecting the via wirings 62V and the power supply lands 34V of the wiring layer 34 in the via holes 61V as well as the area connecting the via wirings 62V and the first electrode 52 of the thin film capacitor 50 may be increased. This improves the connection reliability of the via wirings 62V and the power supply lands 34V and the connection reliability of the via wirings 62V and the first electrode 52. In the same manner, the area connecting the via wirings 62G and the ground lands 34G of the wiring layer 34 in the via holes 61G as well as the area connecting the via wirings 62G and the second electrode 53 of the thin film capacitor 50 may be increased. This improves the connection reliability of the via wirings 62G and the ground lands 34G and the connection reliability of the via wirings 62G and the second electrode 53.

It should be apparent to those skilled in the art that the foregoing embodiments may be implemented in many other specific forms without departing from the scope of this disclosure. Particularly, it should be understood that the foregoing embodiments may be implemented in the following forms.

Figure 9:
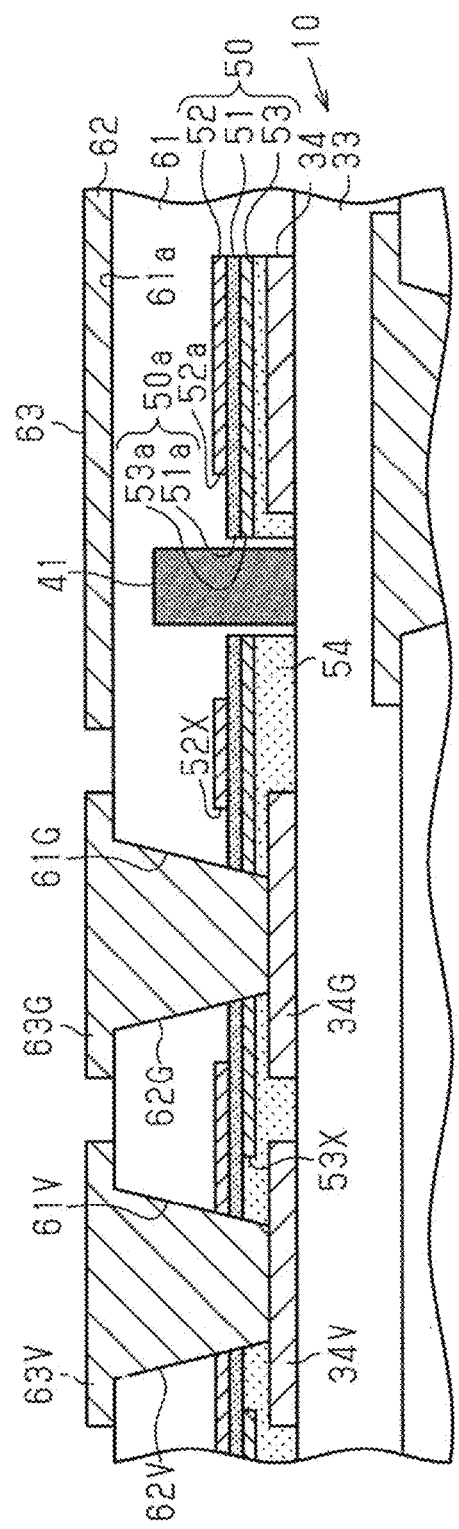
FIG. 9 is a partially enlarged cross-sectional view schematically illustrating a modified example of a wiring substrate.

In the above embodiment, as illustrated in FIG. 1B, the size (diameter) of the post 41 and the size (diameter) of the reference hole 50a are set to be the same. Instead, as illustrated in FIG. 9, the side surface of the post 41 may be spaced apart by a gap from the side wall of the reference hole 50a. The gap may be formed, for example, by setting the size (diameter) of the post 41 to be smaller than the size (diameter) of the reference hole 50a. Even with such a gap, the misalignment of the thin film capacitor 50 is limited when forming the insulation layer 61 covering the thin film capacitor 50 and the posts 41. Thus, the mounting accuracy of the thin film capacitor is improved. The gap facilitates insertion of the posts 41 into the thin film capacitor 50. Also, entrance of the insulation layer 61 into the gap increases the strength. In the example illustrated in FIG. 9, the reference holes 50a are formed by the through holes 51a and the through holes 53a in the same manner as the above embodiment. Instead, the reference holes 50a may be formed by only the through holes 51a. In other words, the through holes 53a may have larger diameters than the through holes 51a.

In the above embodiment, one thin film capacitor 50 is mounted on the wiring substrate 1. Instead, a plurality of thin film capacitors may be mounted.

Figure 10:
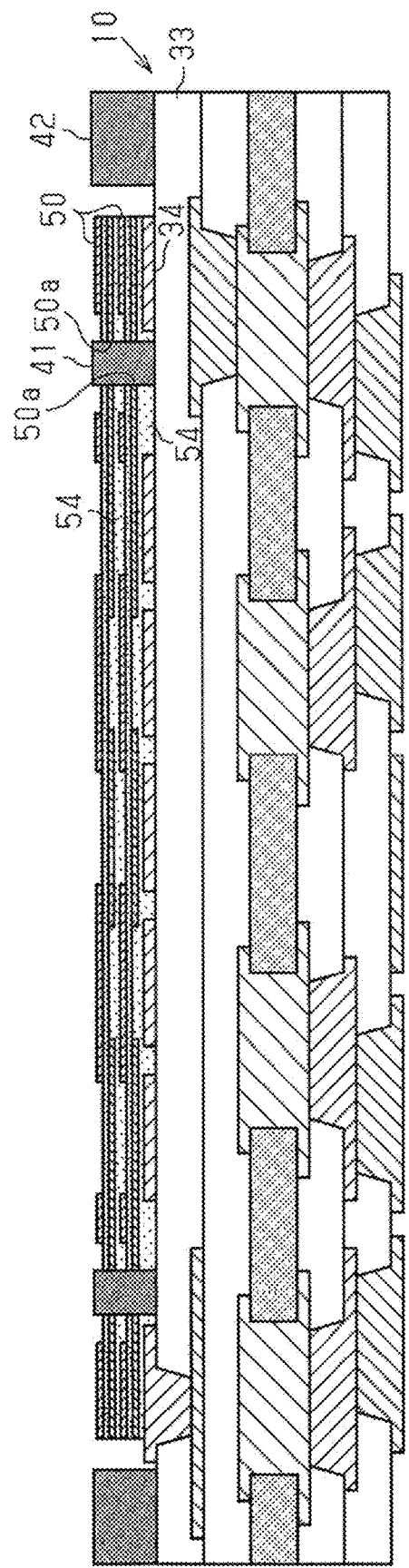
FIG. 10 is a schematic cross-sectional view illustrating another modified example of a wiring substrate.

For example, as illustrated in FIG. 10, two thin film capacitors 50 may be mounted on a wiring substrate. Even in this case, the posts 41 allow for alignment of each thin film capacitor 50. In the example of FIG. 10, a first thin film capacitor 50 is mounted on the upper surface of the substrate body 10, and a second thin film capacitor 50 is mounted on the first thin film capacitor 50. Instead, the two thin film capacitors 50 may be arranged so as not to overlap with each other in a plan view. After the thin film capacitors 50 are mounted, the wiring substrate may be provided through the same manufacturing steps as the above embodiment (e.g., formation of the insulation layer 61).

In the above embodiment, the wiring substrate 1 includes the core substrate 11. Instead, the wiring substrate 1 may be a coreless wiring substrate, which does not include a core substrate.

In the above embodiment, the number of wiring layers may be changed. The wiring substrate may be formed so that two or more semiconductor elements are mountable. Further, an electronic component (e.g., inductor or resistor) other than a semiconductor element may be mounted.

In the above embodiment, the posts 41 are formed from a photosensitive insulation resin. Instead, for example, a metal such as copper may be used to form posts 41.

In the above embodiment, the posts 41 and the frame 42 are formed from the same material. Instead, the posts 41 and the frame 42 may be formed from different materials.

CLAUSES

This disclosure further encompasses embodiments describes below.

1. A method for manufacturing a wiring substrate, the method including:
  forming a post on an upper surface of a substrate body;
  mounting a thin film capacitor, which includes a reference hole extending through the thin film capacitor in a thicknesswise direction, on the upper surface of the substrate body with an adhesive layer located in between so that the post is inserted through the reference hole; and
  forming a first insulation layer to cover the thin film capacitor and the post.

2. The method according to clause 1, wherein
  the thin film capacitor includes a dielectric layer, a first electrode, and a second electrode,
  the dielectric layer is held between the first electrode and the second electrode,
  the method further includes forming a first wiring layer on an upper surface of the first insulation layer, wherein the first wiring layer includes
    a first connection pad and a second connection pad configured to be connected to a semiconductor element,
    a first via wiring extending through the first insulation layer and the thin film capacitor to connect the first connection pad to the first electrode of the thin film capacitor, and
    a second via wiring extending through the first insulation layer and the thin film capacitor to connect the second connection pad to the second electrode of the thin film capacitor.

3. The method according to clause 2, wherein
  the substrate body includes
    a second insulation layer, which is an uppermost insulation layer of the substrate body, and
    a second wiring layer formed on an upper surface of the second insulation layer,
  the forming a post includes
    forming a photosensitive insulation resin to cover the upper surface of the substrate body, and
    forming the post from the photosensitive insulation resin, and
  the mounting a thin film capacitor includes forming the thin film capacitor on the upper surface of the second insulation layer and an upper surface of the second wiring layer with the adhesive layer located in between.

4. The method according to clause 3, wherein
  the second wiring layer includes a first land and a second land,
  the first electrode of the thin film capacitor includes a first opening and the second electrode of the thin film capacitor includes a second opening so that the first opening and the second opening do not overlap with each other in a plan view, and
  the forming a first wiring layer includes
    irradiating the upper surface of the first insulation layer with laser beams to form a first via hole and a second via hole, wherein the first via hole extends through the first insulation layer, the dielectric layer, and the first electrode to expose an upper surface of the first land and the second via hole extends through the first insulation layer, the dielectric layer, and the second electrode to expose an upper surface of the second land, and
    forming the first via wiring in the first via hole and the second via wiring in the second via hole so that the first via wiring electrically connects the first electrode exposed in the first via hole to the first land exposed in the first via hole and so that the second via wiring electrically connects the second electrode exposed in the second via hole to the second land exposed in the second via hole.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:
  a substrate body;
  a thin film capacitor including:
    a first electrode including an opening;
    a dielectric layer including a first through hole; and
    a second electrode including a second through hole,
    wherein the dielectric layer is held between the first electrode and the second electrode;

an alignment post comprised of an insulation member, the alignment post formed on an upper surface of the substrate body and extending into the opening, the first through hole, and the second through hole, wherein a side surface of the alignment post is in contact with a side wall of the dielectric layer defining the first through hole and a side wall of the second electrode defining the second through hole, and wherein the first through hole and the second through hole define a reference hole for alignment of the thin film capacitor by the alignment post; and a first insulation layer covering the thin film capacitor and the alignment post, wherein the alignment post is electrically isolated from the first electrode and the second electrode.

2. The wiring substrate according to claim 1, further comprising a first wiring layer formed on an upper surface of the first insulation layer, wherein the first wiring layer includes
a first connection pad and a second connection pad that are configured to be connected to a semiconductor element,
a first via wiring extending through the first insulation layer and the thin film capacitor to connect the first connection pad to the first electrode of the thin film capacitor, and
a second via wiring extending through the first insulation layer and the thin film capacitor to connect the second connection pad to the second electrode of the thin film capacitor.

3. The wiring substrate according to claim 2, wherein the substrate body includes
a second insulation layer, which is an uppermost insulation layer of the substrate body, and
a second wiring layer formed on an upper surface of the second insulation layer,
the thin film capacitor is located on the upper surface of the second insulation layer and an upper surface of the second wiring layer, and
the alignment post is formed on at least one of the upper surface of the second insulation layer and the upper surface of the second wiring layer.

4. The wiring substrate according to claim 3, wherein the second wiring layer includes a first land and a second land,
the first electrode of the thin film capacitor includes a first opening and the second electrode of the thin film capacitor includes a second opening so that the first opening and the second opening do not overlap with each other in a plan view,
the first via wiring fills a first via hole, wherein the first via hole extends through the first insulation layer, the dielectric layer, and the first electrode and is located in the second opening of the second electrode,
the first via wiring is electrically connected to the first electrode exposed in the first via hole and the first land of the second wiring layer exposed in the first via hole,
the second via wiring fills a second via hole, wherein the second via hole extends through the first insulation layer, the dielectric layer, and the second electrode and is located in the first opening of the first electrode, and
the second via wiring is electrically connected to the second electrode exposed in the second via hole and the second land of the second wiring layer exposed in the second via hole.

5. The wiring substrate according to claim 1, wherein the alignment post is formed from a photosensitive insulation resin.

6. The wiring substrate according to claim 1, further comprising a frame formed on the upper surface of the substrate body to surround the thin film capacitor.

7. The wiring substrate according to claim 1, wherein
the first through hole of the dielectric layer has a diameter that is smaller than a diameter of the opening of the first electrode,
the second through hole of the second electrode has a diameter that is larger than or equal to the diameter of the first through hole of the dielectric layer, and
the reference hole has a diameter that is equal to the diameter of the first through hole of the dielectric layer.

8. The wiring substrate according to claim 7, wherein the alignment post has a diameter that is equal to the diameter of the reference hole.

9. The wiring substrate according to claim 7, wherein the alignment post has a diameter that is smaller than the diameter of the reference hole.

10. The wiring substrate according to claim 1, wherein
the thin film capacitor is rectangular in a plan view,
the reference hole is one of two reference holes that are formed proximate to two diagonal corners of the thin film capacitor, and
the alignment post is inserted through each of the two reference holes.

11. The wiring substrate according to claim 1, wherein
the thin film capacitor is one of a plurality of thin film capacitors mounted on the upper surface of the substrate body, and
the alignment post is inserted through the reference hole of each of the plurality of thin film capacitors.

12. A semiconductor device comprising:
the wiring substrate according to claim 1; and
at least one semiconductor element mounted on the wiring substrate.

* * * * *